United States Patent
Bailer (10) Patent No.: US 10,667,420 B2
(45) Date of Patent: May 26, 2020

(54) VISUAL DISPLAY UNIT

(71) Applicant: NOVOMATIC AG, Gumpoldskirchen (AT)

(72) Inventor: Bruno Bailer, Pottendorf (AT)

(73) Assignee: NOVOMATIC AG, Gumpoldskirchen (AT)

(*) Notice: Subject to any disclaimer, the term of this patent is extended or adjusted under 35 U.S.C. 154(b) by 780 days.

(21) Appl. No.: 14/596,106

(22) Filed: Jan. 13, 2015

(65) Prior Publication Data
US 2015/0201517 A1    Jul. 16, 2015

(30) Foreign Application Priority Data

Jan. 13, 2014 (DE) .................... 20 2014 000 372 U (51) Int. Cl.
| | |
|---|---|
| *A63F 13/00* | (2014.01) |
| *H05K 7/14* | (2006.01) |
| *G07F 17/32* | (2006.01) |
| *H05K 5/00* | (2006.01) |
| *H05K 5/02* | (2006.01) |
| *A63F 13/90* | (2014.01) |

(52) U.S. Cl.
CPC ........... *H05K 7/14* (2013.01); *G07F 17/3211* (2013.01); *H05K 5/0017* (2013.01); *H05K 5/0217* (2013.01); *A63F 13/90* (2014.09)

(58) Field of Classification Search
CPC .............................. G07F 17/3202; A63F 13/08
See application file for complete search history.

(56) References Cited

U.S. PATENT DOCUMENTS

| | | | |
|---|---|---|---|
| 6,223,908 B1 | 5/2001 | Kurtsman | |
| 6,474,758 B1 * | 11/2002 | Hedrick | G07F 17/32 312/223.1 |
| 7,453,685 B2 * | 11/2008 | Lube | G06F 1/1601 312/223.2 |
| 2004/0018870 A1 * | 1/2004 | Cole | A63F 13/08 463/20 |
| 2005/0064941 A1 * | 3/2005 | Hedrick | A63F 13/08 463/46 |
| 2005/0064942 A1 * | 3/2005 | Hedrick | A63F 13/08 463/46 |
| 2005/0134758 A1 | 6/2005 | Liu | |

(Continued)

FOREIGN PATENT DOCUMENTS

| | | |
|---|---|---|
| DE | 9204958 | 6/1992 |
| DE | 19837705 | 3/2000 |

(Continued)

*Primary Examiner* — Omkar A Deodhar
*Assistant Examiner* — Eric M Thomas
(74) *Attorney, Agent, or Firm* — Levine Bagade Han LLP (57) ABSTRACT

The present invention relates to a visual display unit, preferably in the form of a gaming and/or amusement machine, having a unit housing which has a housing door for opening and closing the unit housing, the housing door forming a frame for at least one display screen, the frame limbs of which frame enclose the at least one display screen and delimit a frame cutout. According to the invention, the frame of the housing door has a modular construction and can be assembled in a variable manner from a plurality of frame parts in different configurations, in which the frame has a different number of frame cutouts and/or frame cutouts of different sizes.

20 Claims, 10 Drawing Sheets

(56) References Cited

U.S. PATENT DOCUMENTS

2005/0255924 A1* 11/2005 Cole .................. G07F 17/32
                                                       463/46
2007/0225079 A1*  9/2007 Cole .................. G07F 17/32
                                                       463/46
2007/0287543 A1* 12/2007 Tanabe ............... G07F 17/34
                                                       463/46
2010/0137060 A1   6/2010 Cole

FOREIGN PATENT DOCUMENTS

EP         1193818        4/2002
WO    WO 2005/041139      5/2005

* cited by examiner

VISUAL DISPLAY UNIT

CROSS-REFERENCE TO RELATED APPLICATIONS

This application claims priority to German Patent Application Number DE 20 2014 000 372.6 filed on Jan. 13, 2014, the content of which is incorporated herein by reference in its entirety.

The present invention relates to a visual display unit, preferably in the form of a gaming and/or amusement machine, having a unit housing which has a housing door for opening and closing the unit housing, the housing door forming a frame for at least one display screen, the frame limbs of which frame enclose the at least one display screen and delimit a frame cutout.

Visual display units of this type can be gaming and/or amusement machines or gambling machines which can be configured as terminals, in particular in the form of floor-standing units or what are known as stand-alone units, as are used, for example, in casinos and amusement arcades. In principle, however, the units can also be configured as wall-mounted or tabletop units which can be mounted on a wall or can be set up on a table. Other uses such as ATM terminals, ticket counter terminals and the like are conceivable.

Visual display units of this type comprise at least one display screen which is attached at a suitable height for a user who is standing or is seated in front of the unit, in order to display information and/or to receive control or input signals if the display screen is configured as a touchscreen. Here, in addition to the at least one display screen, an operating panel with input buttons, levers or the like, card reading units and optionally also cash receiving and dispensing modules can be provided, for example, below the display screen, which can be connected to corresponding functional assemblies in the interior of the unit housing or can be arranged themselves at least partially in the interior of the housing. The unit housing can accommodate, for example, in particular a control unit or computer unit which can, for example, actuate the display screens and/or control gameplay.

Depending on the information and functions of the visual display unit to be provided, it can be advantageous here to provide more than one display screen, for example to present the actual game contents on one display screen and to present additional information on a further display screen, such as game rules, possible wins and the like. An additional display screen is sometimes also used to present a plurality of games in parallel, for example a main game and a bonus game. If a plurality of display screens are used in the way which is mentioned, they can be arranged above one another, oriented either so as to lie in a common plane and/or parallel to one another, optionally with an offset with respect to one another in the depth direction of the unit, that is to say in the direction of the viewing axis of the display screens. In particular, a plurality of display screens which are arranged one above another can also be arranged such that they are tilted at an obtuse angle with respect to one another, in order to achieve an orientation which is as perpendicular as possible with respect to the viewing axis of a user, in accordance with the different viewing axes of the respective display screens. Units of this type are sometimes called slant-top units. Instead of or in addition to an arrangement of this type of the display screens above one another, a plurality of display screens can also be arranged next to one another, however, it being possible for an arrangement of the display screens which is in parallel or else tilted at an obtuse angle to be provided here in a corresponding way.

A visual display unit of the abovementioned type in the form of a gaming and/or amusement machine is known, for example, from the document EP 16 71 284 B1.

In previous visual display units of the abovementioned type, it is disadvantageous that the entire unit housing including housing door often has to be replaced when the unit is changed over or retrofitted, for example in order to accommodate an additional display screen if, during an upgrade of a gaming machine, the latter is also to display a bonus game in addition to the main game. The previously used housings have to be thrown away or can at best be recycled. In a similar way, in the context of the manufacture of new units, it is also already complicated or disadvantageous if it is necessary to provide a correspondingly high number of housing types for different unit types which use display screens of different sizes or a different number of display screens.

Proceeding herefrom, the present invention is based on the object of providing an improved visual display unit of the abovementioned type which avoids disadvantages of the prior art and develops said prior art in an advantageous way. In particular, a visual display unit which can be changed over and retrofitted inexpensively is to be provided, the number of display screens and formats of display screens of which can be adapted simply to the respective unit type and its function.

According to the invention, the abovementioned object is achieved by way of a visual display unit according to Claim 1. Preferred refinements of the invention are the subject matter of the dependent claims.

It is therefore proposed to assemble the housing door which forms a frame which encloses a display screen and has one or more frame cutouts for one or more display screens from a modular system with separate frame parts which are in each case compatible with one another, with the result that the housing door or the frame which encloses the display screen can be reconfigured easily by way of a different arrangement of identical frame parts and/or the use of different frame parts. The frame is no longer configured in one piece, as known from the prior art, but rather is constructed from a plurality of frame parts which can be fixed onto one another in a variable manner. According to the invention, the frame of the housing door has a modular construction and can be assembled in a variable manner from a plurality of frame parts in different configurations, in which the frame has a different number of frame cutouts and/or frame cutouts of different sizes. A larger frame cutout and/or a frame with a plurality of frame cutouts can be configured by way of the use of additional frame parts and/or longer frame parts, whereas conversely a smaller frame cutout and/or fewer frame cutouts for a smaller display screen or fewer display screens can be configured by way of the removal of frame parts and construction of the frame from fewer frame parts and/or shorter frame parts. Here, individual frame parts can be used multiple times, that is to say for different frame configurations, with the result that a large number of frame configurations can be achieved by way of a kit comprising a small number of frame parts.

The frame parts are advantageously connected to one another releasably, for example by means of screw connections or releasable positively locking connections such as releasable latching connections, with the result that a frame can subsequently be reconfigured and frame parts which have been installed once can be reused in a new frame configuration. Although a non-releasable connection of the frame parts also comes into consideration, which would already entail an advantage in terms of manufacturing technology in the manufacture of new parts, that is to say the manufacture of housing doors of new units, releasable connections are preferred, in order to make subsequent retrofitting of the units possible and in the process to allow the reuse of the frame parts.

Here, the frame parts, from which the frame can be assembled, can form entire frame limbs or only parts of individual frame limbs. As an alternative, individual frame parts can also form a plurality of frame limbs or parts of a plurality of flame limbs, it being possible, for example, for corner pieces to be provided which form both a part of a side limb and also a part of a transverse limb.

In one advantageous development of the invention, the frame parts have connecting means which are compatible to one another on their end sections, by means of which connecting means a defined frame part can be connected optionally to different other frame parts. Here, the connecting means which are of compatible configuration ensure that different frame parts can be connected to a defined frame part.

In particular, the connecting means can be positioned in arrangement patterns which correspond to one another on the end sections, for example in the form of an identical, repeating screw hole and/or threaded hole arrangement, a plug-in pin pattern or a corresponding, repeating pattern of latching tongues and recesses for latching the frame parts. The frame parts can advantageously have in each case the same arrangement pattern of connecting means on their end sections which lie opposite one another, for example two screw holes which are arranged at an identical spacing from one another and from the end contour on each end section. As an alternative, it would also be possible to arrange a first arrangement pattern on one end section of a frame part, for example with two screw holes, and to arrange a second arrangement pattern on a second end section, for example with three screw holes, and to provide said two arrangement patterns correspondingly in a plurality of or all the frame parts.

The connecting means can advantageously be provided in a fixed, unchanging arrangement pattern in their positioning relative to the connection contours of the end sections of the frame parts, for example in such a way that a plurality of connecting means, for example screw boles, are spaced apart in each case at a fixedly defined spacing from a mating face and/or from a connection contour, by way of which the respective frame part can be connected with an accurate fit to the next frame part or the connection contour or mating face there.

In particular, the end sections of different frames which are to be connected to one another and of frame parts which are adjacent in the connected state can be configured in such a way that they overlap one another, connecting means which are oriented so as to be aligned in the overlapping section being provided, for example, in the form of screw or threaded holes, plug-in pin recesses or latching tongues and recesses.

In one development of the invention, it is possible for side limbs of the frame which lie opposite one another and/or transverse connecting limbs which connect the side limbs to be constructed in each case from a different number of side parts which can be fixed onto one another and can be connected to one another and/or a different number of transverse parts which can be fixed onto one another and can be connected to one another, with the result that the side limbs can be configured in different lengths by a different number of side parts and/or side parts of different lengths being fixed onto one another and/or the transverse connecting limbs can be configured in different lengths by a different number of transverse parts and/or transverse parts of different lengths being fixed onto one another.

Here, in the context of the present application, the abovementioned side limbs can mean the upright side limbs which are arranged on the right and left of a display screen or can extend perpendicularly, whereas the transverse limbs can be oriented horizontally. In principle, however, the terminology can also be understood conversely, in such a way that side limbs mean horizontal frame limbs and transverse limbs mean upright frame limbs.

In order for it to be possible to adapt the frame and the frame cutout which is formed by it to different display screen formats and/or to different numbers of display screens, a further side part or a transverse connecting part can advantageously be connected in each case optionally to side parts which are arranged so as to lie opposite one another. As a result, two, three, four or else more side parts can be arranged behind one another, in order to lengthen the corresponding side limb accordingly, or else only one side part can be used, to which a transverse connecting part can be connected, in order to provide the corresponding transverse delimiting of the frame cutout. The optional capability of attaching a further side part or a transverse connecting part, in particular a transverse termination part, allows the respective side part to be used in a variable manner and to be used for different display screen formats and different numbers of display screens.

In particular, the frame parts and the connecting means which are provided on them can be configured in such a way that it is possible for a transverse termination part or an intermediate transverse part together with a further side part to be connected optionally to a side part, with the result that a frame node is formed, from which frame parts emanate, namely two side parts which form a side limb and an intermediate transverse part which extends transversely with respect thereto. As a result of the capability of attaching or connecting intermediate transverse parts of this type to a side transverse limb or two side parts which can be connected to one another, different numbers of display screen cutouts or frame cutouts can be configured. An intermediate transverse part divides the spatial region or frame cutout which is enclosed by the side limbs and the transverse termination limbs into a plurality of frame cutouts, in which a plurality of display screens can be arranged.

In one advantageous development of the invention, the abovementioned intermediate transverse parts can at the same time serve to connect two adjacent side parts of one side limb. The abovementioned intermediate transverse parts can comprise connecting means for connecting to two side parts which are fixed to one another, with the result that the two side parts can be connected to one another by way of one intermediate transverse part. In contrast to an intermediate transverse part, a transverse termination part needs to have only connecting means for connecting to one side part.

The abovementioned frame parts in the form of the abovementioned side parts and/or in the form of the abovementioned transverse parts can in principle have a straight profile or a straight longitudinal axis and/or can be fixed to one another in such a way that they form straight side limbs or straight transverse limbs of the frame and the frame therefore overall has a planar contour and, in the case of an arrangement of a plurality of display screens, all the display screens are arranged in a parallel or coplanar manner with respect to one another.

In an alternative, advantageous development of the invention, however, the side parts and/or the transverse parts can also have a contour profile which is curved in an arcuate manner and/or is bent in a polygonal manner or a longitudinal axis which is correspondingly curved in an arcuate manner and/or bent in a polygonal manner, in order to form side limbs and/or transverse limbs of the frame which are curved in an arcuate manner and/or are bent in a polygonal manner. As an alternative or in addition to a curved or bent profile of the longitudinal axes, the side parts and/or transverse parts can also be configured in the region of their end sections and/or their connection contours and/or connecting means in such a way that two respectively adjacent side parts and/or two respectively adjacent transverse parts can be fixed to one another at an obtuse angle, which results in a profile of the transverse limbs or side limbs which is bent correspondingly in a polygonal manner as a result of the interfaces or connecting points which are bent away at an obtuse angle between the side parts and/or between the transverse parts.

In particular, by way of a longitudinal axis profile of the side limbs and/or the transverse limbs which is curved or bent in an arcuate manner in this way, a plurality of display screens which are arranged above one another and/or a plurality of display screens which are arranged next to one another can be positioned in an arrangement which is inclined at an obtuse angle with respect to one another and can be enclosed by the frame, in order, in particular, to orient the display screens in each case with respect to the eyes of a unit user, with the result that the latter can look at the display screen as perpendicularly as possible.

In particular, the frame can have a plurality of frame cutouts which are inclined at an obtuse angle with respect to one another and can enclose a plurality of display screens which are inclined at an obtuse angle with respect to one another and are arranged above one another or next to one another.

The at least one display screen can be arranged and fastened in the interior of the unit housing, with the result that the abovementioned frame or the housing door is moved away from the display screens during opening. As an alternative, in one development of the invention, however, the at least one display screen can also be fastened to the housing door, in particular the abovementioned frame, with the result that the display screen is moved together with the frame during opening of the housing door. As a result, the rear side of a respective display screen and a component which is positioned behind the display screen in the unit housing advantageously also become accessible when the housing door is opened. The frame can have display screen fastening means which can be configured in a positively locking manner, for example in the form of screw-down or clamp holders which at least make it possible to fasten one or more display screens to the unit door and possibly remain unused if the display screens are not fastened to the housing door, but rather are mounted in the unit housing body. Surprisingly, even in the case of the above-described, modular construction of the frame of the housing door, a relatively heavy display screen can be mounted on the housing door or the frame, without the multiple-piece, assembled frame being unstable or overloaded as a result. On the contrary, the fastening of the display screen or the display screens to the frame imparts additional stability to the modular frame construction, in particular if a display screen is fastened to a plurality of frame parts and/or frame limbs. As a result, the display screen is given a frame-supporting or frame-stabilizing function.

The frame of the housing door, which frame is assembled from separate frame parts, can be a stable, self-supporting structure independently of display screens which are mounted on it or are not mounted on it, which structure can be pivoted open and closed despite the at least one frame cutout. Independently of the remaining unit housing, the frame structure of the housing door, which frame structure is of self-supporting, dimensionally stable configuration despite its modular construction, forms a pivotable body unit of inherently stable construction which is sufficiently load-bearing, in order to support one or more display screens if the latter is/are fastened to the housing door.

In order to obtain a high quality visual unit surface and to achieve a clean finish between the housing door or frame and the display screen, the at least one display screen can advantageously be fastened to a frame rear side, and the frame can cover a front-side edge strip of the display screen at least in sections, with the result that, in the manner of a bezel, the frame covers a preferably narrow edge strip of the display screen as viewed from the front side of the display screen. As an alternative, however, it would also be possible to release the display screen with respect to the enclosing frame, with the result that a gap remains between the frame inner contour and the display screen outer contour, or to adapt it exactly to the external dimension of the display screen.

In one advantageous development of the invention, at least some of the frame parts can have holding webs which project rearwards from a frame rear side, engage laterally around the display screen and can be connected to the display screen. The abovementioned holding webs at the same time form lateral guides, between which the display screen can be fixed onto the frame from the rear. For example by way of the insertion of transverse pins such as threaded bolts, the display screen can be fixed on the abovementioned holding webs. A rigid, preferably positively locking connection is preferably provided between the frame parts and a respective display screen.

In one advantageous development of the invention, the housing door with the display screens which are optionally fastened thereto can be mounted on a housing main body such that it can be pivoted about a door pivoting axis, it being possible in one advantageous embodiment of the invention for the abovementioned door pivoting axis to extend horizontally, preferably in the region of an upper housing door end section, with the result that the housing door with the display screens which are fastened thereto can be pivoted open in the upward direction. In principle, it would also be conceivable to provide an upright door pivoting axis, with the result that the housing door can be opened in the manner of a cupboard door, or to provide a horizontal door pivoting axis at the lower end section of the housing door, with the result that the housing door can be folded open in the downward direction in the manner of a secretaire lid. By way of an ability to be pivoted open in the upward direction in the manner of a gullwing door, however, the accessibility to the housing interior, for example for an engineer, is improved, since the housing door which is pivoted open is removed from the working region of the engineer.

In the following text, the invention will be described in greater detail using one preferred exemplary embodiment and associated drawings, in which.

Figure 1:
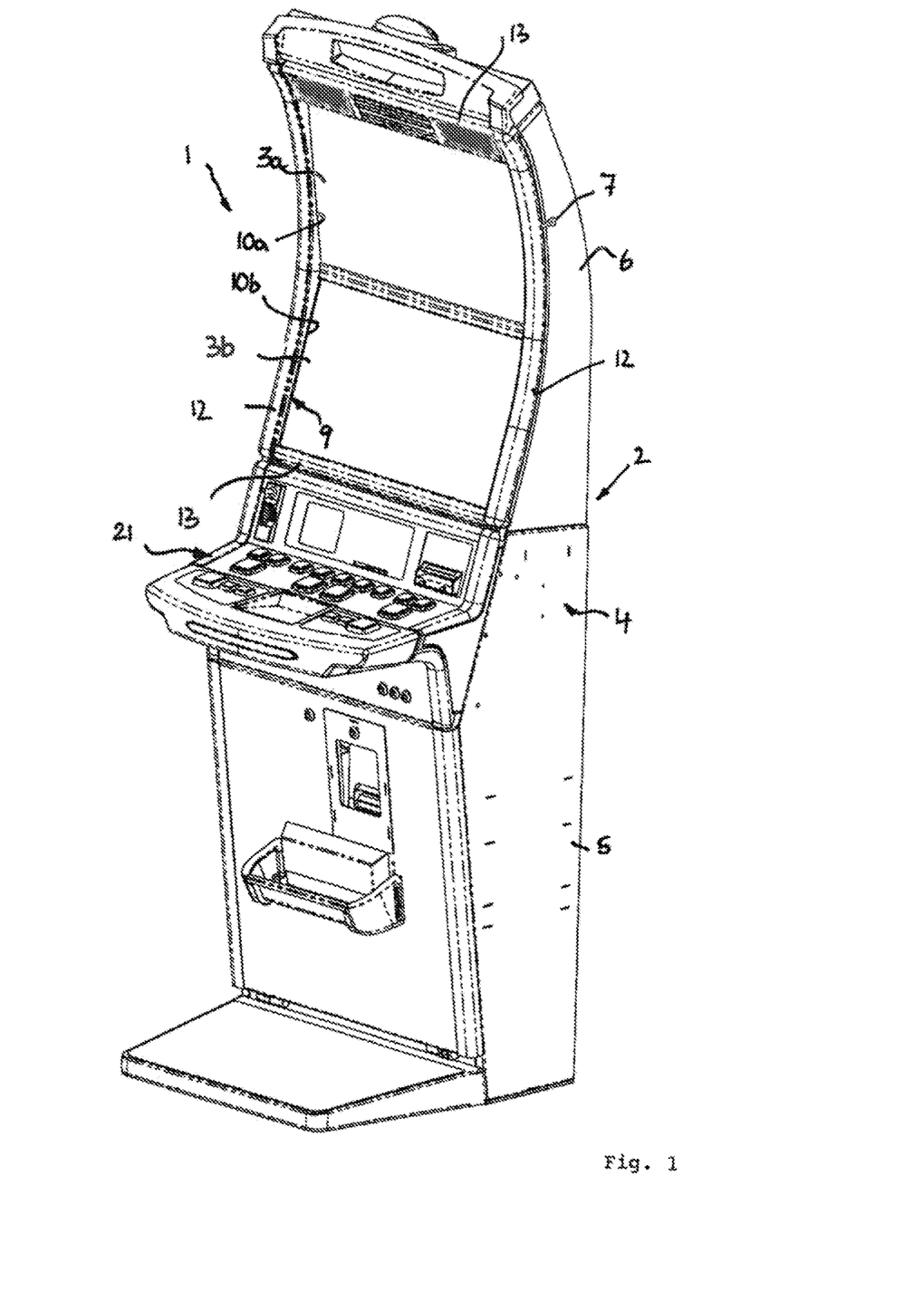
FIG. 1 shows a perspective, diagrammatic front view of a visual display unit in the form of a gaming machine according to one advantageous embodiment of the invention, the housing door which can be pivoted open being configured for two display screens which are inclined at an obtuse angle with respect to one another and are arranged above one another.
Figure 2:
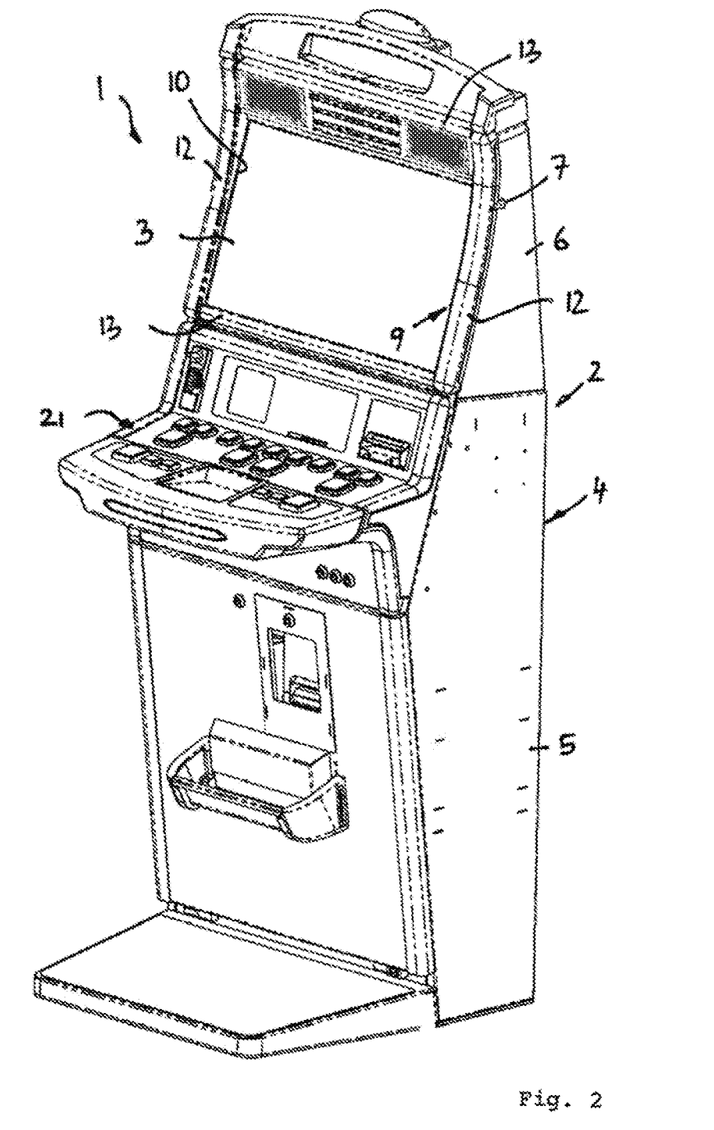
FIG. 2 shows a perspective, diagrammatic side view of a visual display unit similarly to FIG. 1, only one display screen being provided or the housing door being configured for only one display screen.
Figure 3:
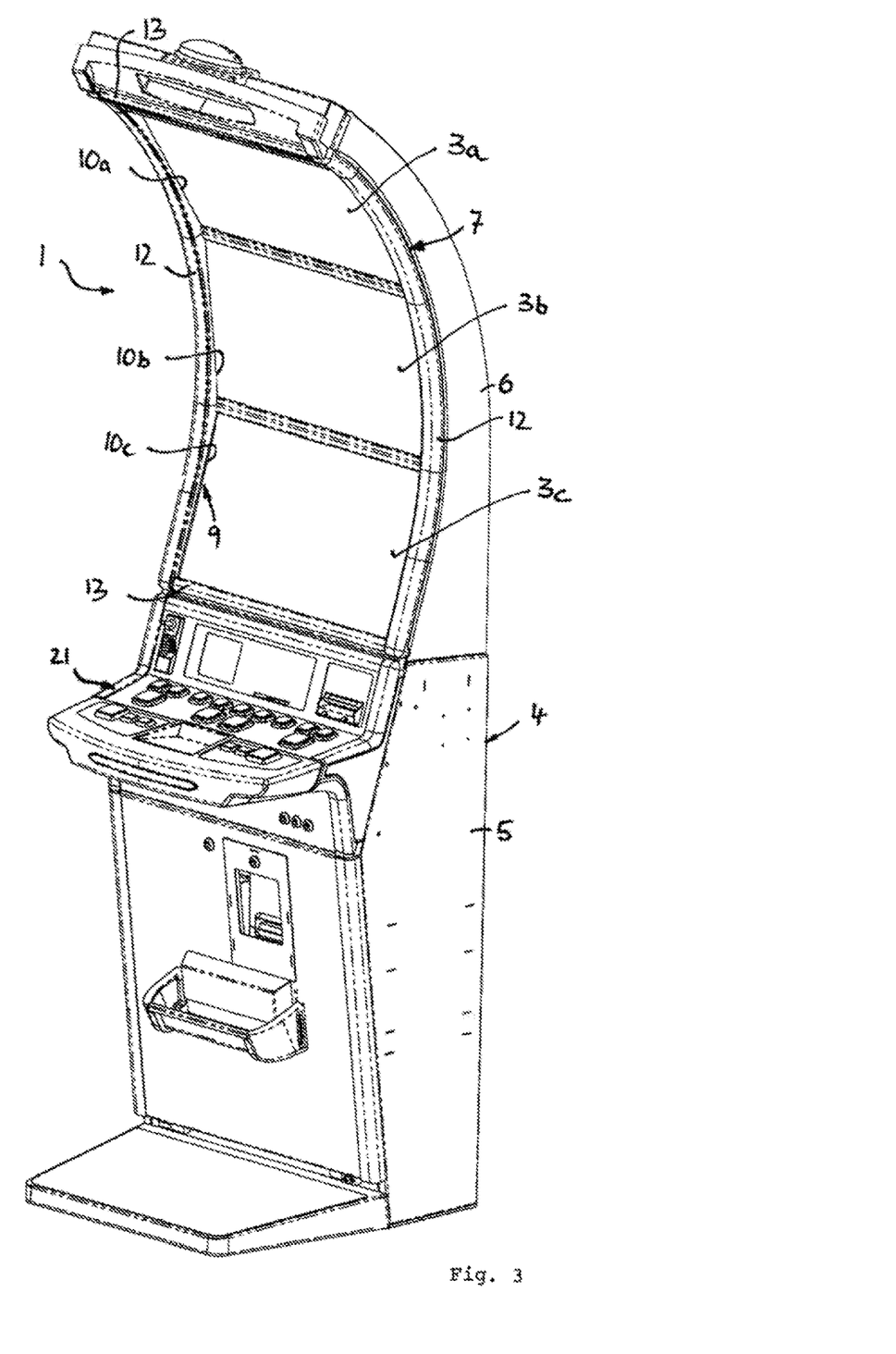
FIG. 3 shows a perspective, diagrammatic front view of a visual display unit similarly to FIGS. 1 and 2, the unit 3 comprising display screens which are arranged above one another and are inclined at an obtuse angle with respect to one another, and the housing door being configured as an enclosure or frame for three display screens of this type which are arranged in the abovementioned way.

As FIG. 1 shows, a visual display unit 1 can be configured as a floor-standing unit, in particular as a stand-alone unit which can be set up in a free-standing manner, and can have an overall elongate, upright (roughly speaking) cuboid unit body 2, in the upper half of which one or more display screens 3 is/are provided. As FIG. 1 shows, these can be two display screens which are arranged above one another and are tilted at an obtuse angle with respect to one another, or else only one display screen, as FIG. 2 shows, or else three or more display screens which can be arranged above one another and/or can be tilted at an obtuse angle with respect to one another, as FIG. 3 shows.

Here, the visual display unit 1 comprises a unit housing 4, on the front side of which the abovementioned display screens 3 are arranged and in the housing interior of which functional components can be arranged such as a computer and control device, a cooling apparatus, a cash processing and/or storing device or the like.

According to one embodiment, the front side (which can also be called the frontal or operator side) of the unit housing 4 comprises an operating section 21 which is arranged below the at least one display screen and is configured, for example, in the manner of a table-shaped operating panel, on which control and operating buttons and the like are provided. A card reading unit, cash receiving and/or dispensing means and functional assemblies or the like which are customary on gaming machines can likewise be provided and can be integrated into the unit housing 4.

Here, the unit housing 4 can comprise a lower housing block or a housing base 5 which comprises the abovementioned operating section and onto which an upper housing part 6 can be fixed, on which the abovementioned display screens 3 are arranged.

Figure 4:
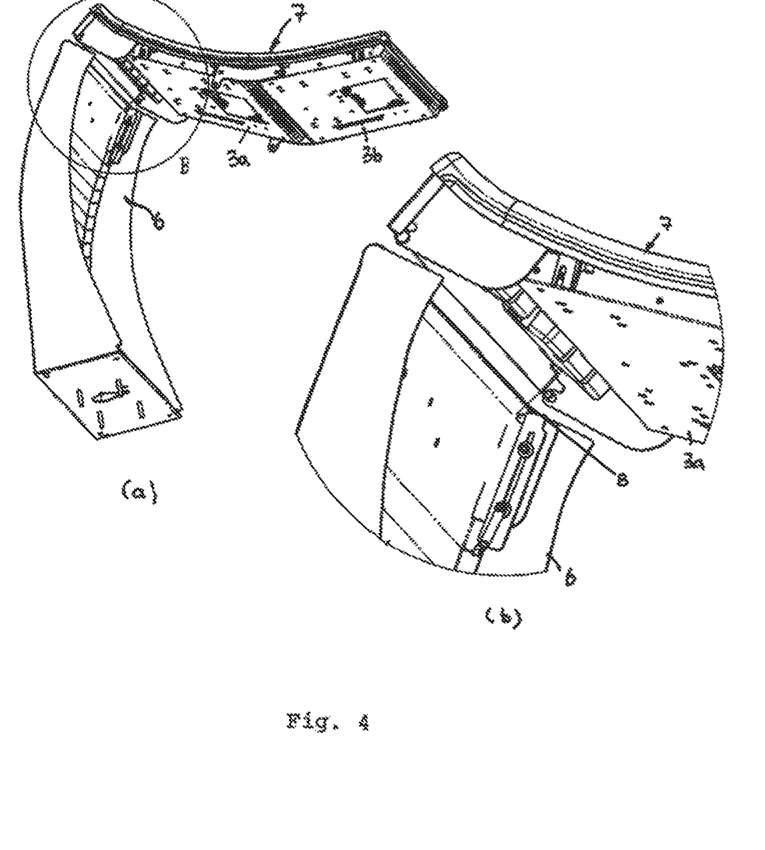
FIG. 4 shows a diagrammatic, perspective illustration of the visual display unit from FIG. 1, which illustration shows the upper part of the unit housing and the housing door which is mounted pivotably thereon and is pivoted open in the upward direction with the display screens fastened thereto, the part view a showing the entire housing door with the two display screens which are mounted thereon and the part view b showing the pivoting bearing connection of the housing door to the housing main body.

The unit housing 4, in particular its upper housing part 6, advantageously comprises a housing door 7, to which the at least one display screen 3 or the plurality of display screens 3a and/or 3b and/or 3c is/are fastened, with the result that the display screens 3 are also moved away from the housing main body during opening of the abovementioned housing door 7. As FIG. 4 shows, the housing door 7 can advantageously be pivoted open in the upward direction in the manner of a gullwing door about a horizontally oriented door pivoting axis 8 which can be arranged on the upper door end region, it being possible for suitable hydraulic lifts or door locks to be provided here, for example in the form of a gas pressure cylinder or the like, in order for it to be possible to hold the door in the upwardly pivoted, open position.

Figure 5:
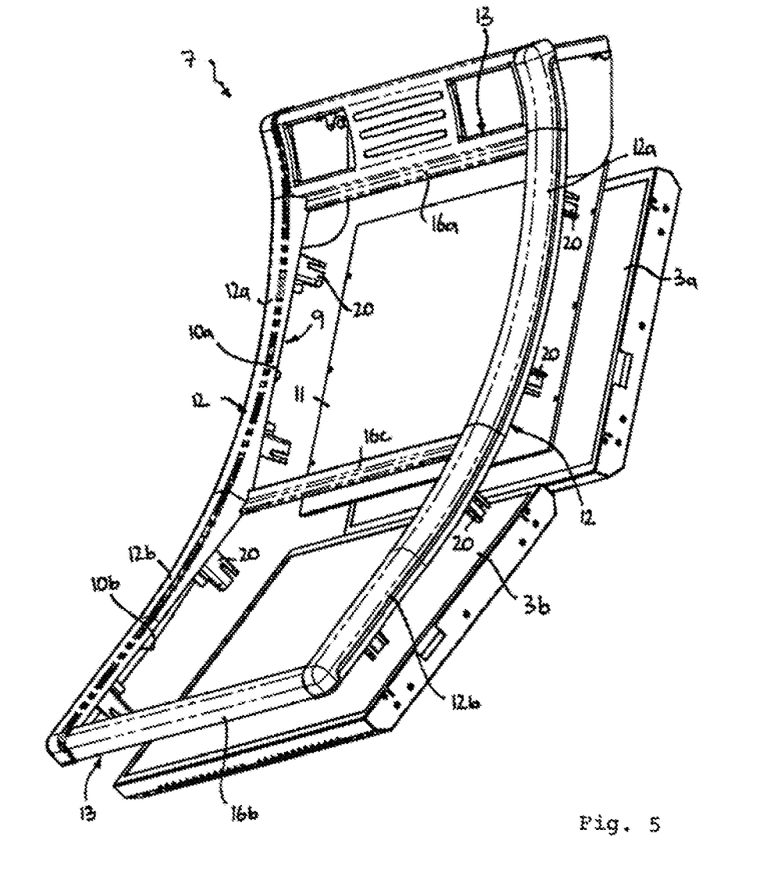
FIG. 5 shows a perspective front view of the frame which forms the housing door and its frame parts, the two display screens which are fastened to the frame being shown detached from the frame and spaced apart to a certain extent in the manner of an exploded illustration.

As FIG. 5 shows, the abovementioned housing door 7 forms a frame 9 which encloses the display screens 3 which are fastened to the housing door 7 and delimits a separate frame cutout 10 for each display screen, FIG. 5 in the present case showing two frame cutouts 10a and 10b which are arranged above one another and are tilted at an obtuse angle with respect to one another by way of example, in order, according to the unit configuration according to FIG. 1, to enclose two display screens 3a and 3b which are arranged above one another and are tilted at an obtuse angle. The abovementioned frame cutouts 10 can be configured in the manner of window openings which offer a view of the respective display screen 3 which is arranged in the frame cutout 10. The frame cutouts 10 can be of open configuration, with the result that the display screen surface is exposed directly. As an alternative, the frame cutouts 10 can be closed by a transparent covering such as a glass or perspex pane 11, behind which the respective display screen can be arranged.

As FIGS. 5 to 10 show, the frame 9 of the housing door 7 has a modular construction and can be assembled in a variable manner from a plurality of frame parts, with the result that the frame 9 can be configured optionally for a single display screen 3a, for two display screens 3a, 3b or else for three display screens 3a, 3b, 3c.

Here, the frame 9 can have two side limbs 12 which lie opposite one another and are oriented in an upright manner, for example, when the housing door 7 is closed, and can comprise transverse connecting limbs 13 which connect the abovementioned side limbs 12 to one another and are oriented horizontally, in particular.

Here, the side limbs 12 can be assembled in a variable manner from a different number of side parts 12a, 12b and 12c (cf. FIG. 8) which can be fixed linearly one behind another, with the result that side limbs 12 of different lengths can be configured depending on the number of side parts. Here, the abovementioned side parts 12a, 12b and 12c can have a straight or slightly arcuately curved profile and/or can be fixed to one another at their joints in a manner which is bent away at an obtuse angle, with the result that the side parts follow the desired display screen arrangement or stipulate the latter correspondingly.

Here, the side parts can comprise end sections which can be fixed to one another obtusely joint to joint, for example can have joint faces which are cut away in a straight manner and by means of which they can be fixed to one another.

In the region of the end sections 14, the side parts 12a, 12b and 12c can comprise connecting means 15, for example in the form of screw or threaded holes which are arranged in a predefined, identical pattern relative to the connection contours, in particular the abutting edges on the end sections 14. For example, each side part can have, on its end sections, two screw or threaded holes which are spaced apart from one another and to which end sections of transverse parts of the transverse connecting limbs 13 can be fastened.

In this case, the transverse connecting limbs 13 have transverse parts 16 which comprise transverse termination parts 16a and 16b and are in each case attached at the ends of the side limbs 12 and can terminate the frame upwards and downwards in the case of an upright orientation of the side limbs 12. The said transverse termination parts 16a and 16b can have connecting sections 17 on their end sections, which connecting sections 17 extend in the direction of the longitudinal axis of the side parts 12a, 12b and 12c and, in the case of a position of sides and transverse parts which are fixed to one another as intended, cover a part, in particular an end section 14 of the respective side part 12a or 12b. Connecting means are provided in the connecting sections 17 of the end sections 18 of the transverse termination parts 16a and 16b, the arrangement pattern of which connecting means corresponds to the arrangement pattern of the connecting means 17 of the side parts 12, with the result that the connecting means on the transverse termination parts 16a and 16b can be connected to the connecting means on the side parts 12. In particular, screw and/or threaded holes can also be provided on the transverse termination parts, which screw and/or threaded holes are flush with the corresponding screw or threaded holes of the side parts in the state, in which they are fixed to one another (cf. FIG. 9). The side limbs (side parts) and transverse limbs preferably have a right-angled arrangement with respect to one another.

Furthermore, the abovementioned transverse parts 16 can comprise intermediate transverse parts 16c and 16d (cf. FIG. 8), by means of which the frame cutout which is enclosed by the frame 9 overall, that is to say the side limbs 12 and the transverse termination parts 16a and 16b, can be divided into a plurality of separate frame cutouts. The abovementioned intermediate transverse parts 16c advantageously extend parallel to the transverse termination parts 16a and 16b and/or perpendicularly with respect to the side limbs 12.

Figure 8:
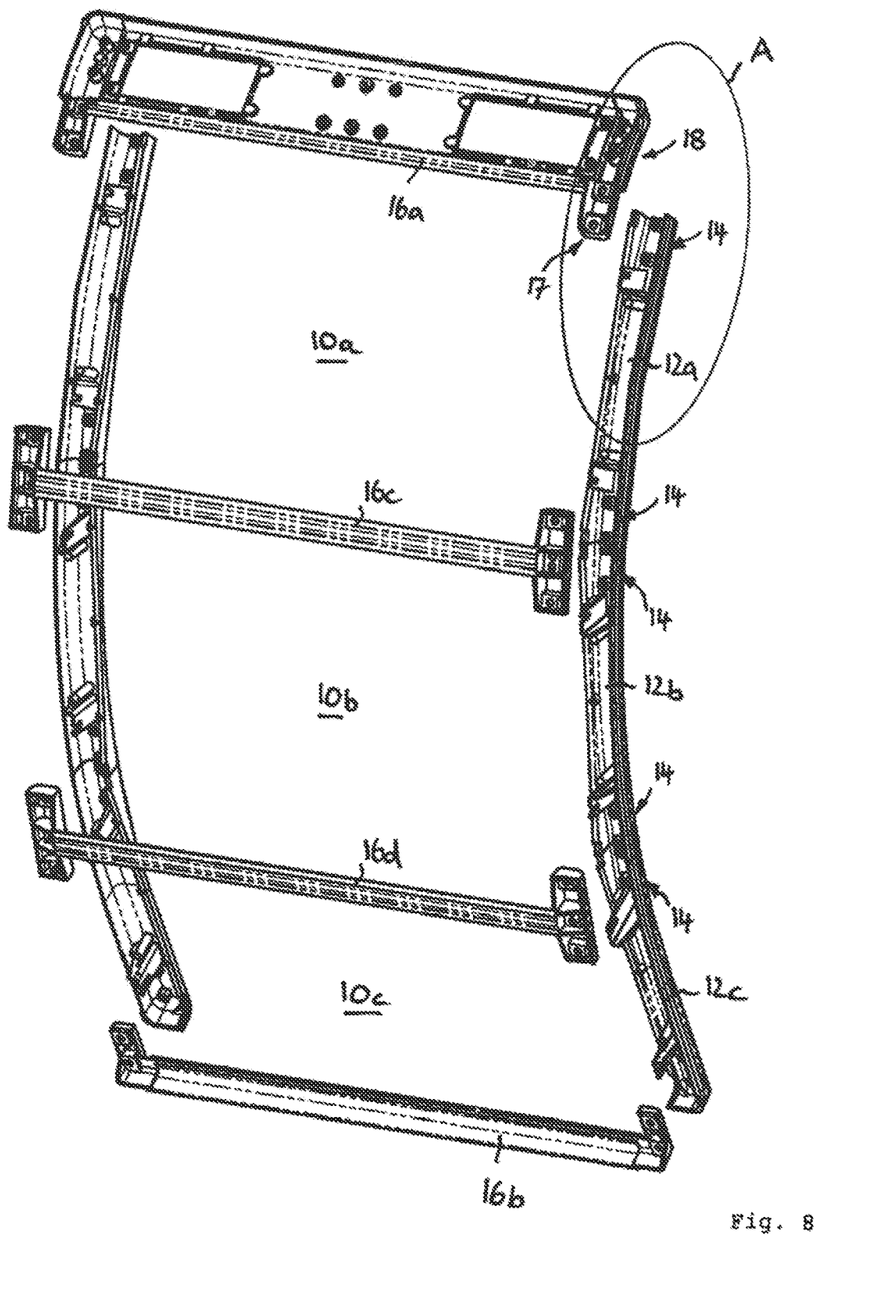
FIG. 8 shows a diagrammatic, perspective illustration of the rear view of the frame for the display screens similarly to FIG. 7, the frame being configured in a different or modified configuration for three display screens which are arranged above one another and defining three frame cutouts, as is the case in the unit configuration according to FIG. 3.
Figure 9:
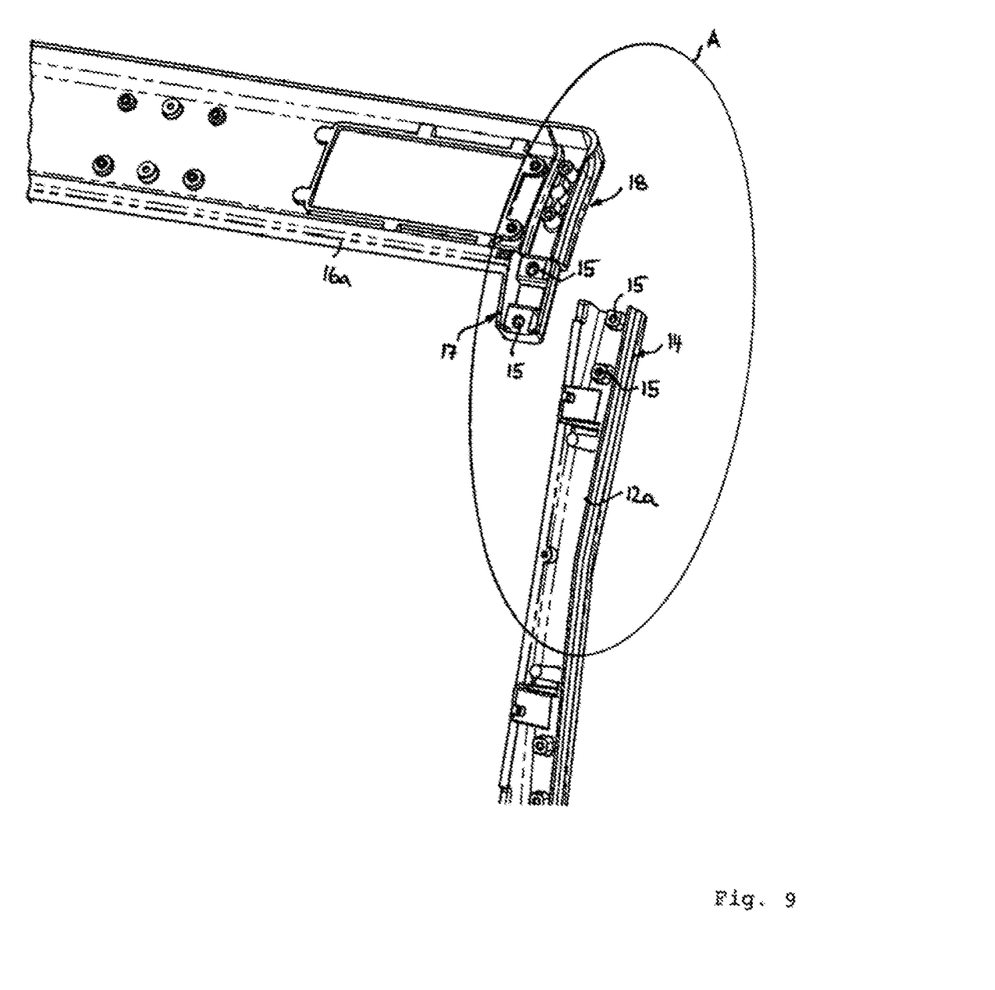
FIG. 9 shows an enlarged illustration of details of the connection and connecting region between a transverse termination part of the frame and a side part of the frame in a detached exploded illustration, the detail which is denoted by A in FIG. 8 being shown.
Figure 10:
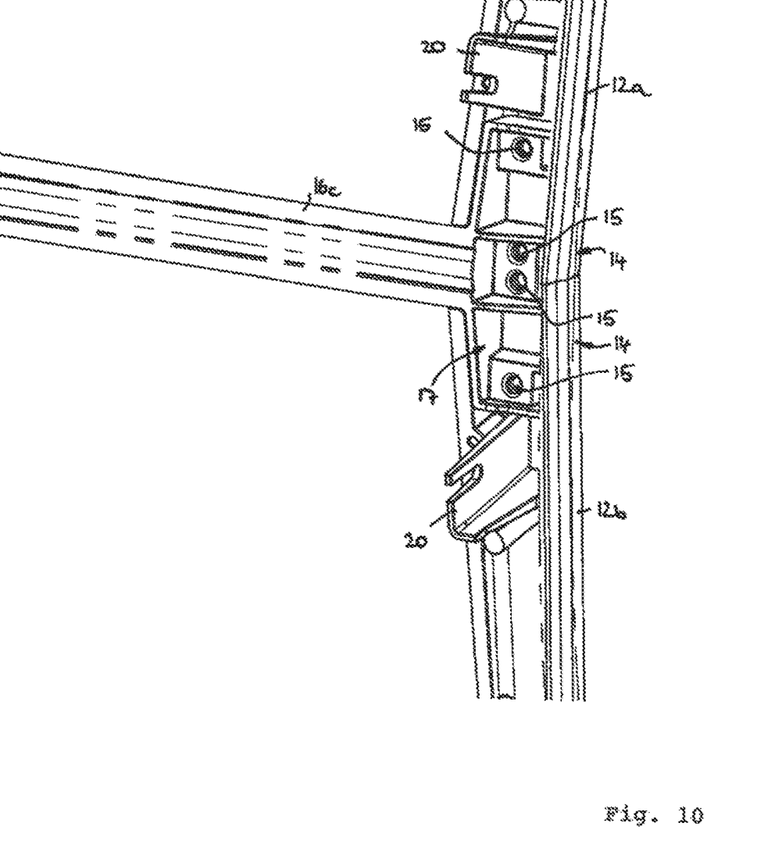
FIG. 10 shows an enlarged illustration of details of the connecting region between two side parts which are fixed to one another behind one another in the longitudinal direction and an intermediate transverse part which connects the two side parts.

Here, the abovementioned intermediate transverse parts 16c and 16d at the same time serve to connect two side parts 12a and 12b or 12b and 12c which are fixed to one another (cf. FIG. 8). To this end, the intermediate transverse parts 16c and 16d can comprise connecting sections 17 in the region of their end sections 18, which connecting sections 17 cover the end sections 14 of two respective side parts which are fixed to one another and have connecting means 15 for connection to two side part. The connecting sections 17 of the intermediate transverse parts 16c and 16d can comprise, in particular, two screw and/or threaded hole arrangements which together have a hole pattern which is aligned with the screw and/or threaded holes in the end sections of two side parts 12a and 12b or 12b and 12c which are fixed to one another (cf FIG. 10). The threaded hole arrangement or the arrangement of the end sections 18 or connecting sections 17 is such that there is preferably a positively locking connection of the side and transverse parts and there is substantially torsional rigidity in all spatial directions.

As results from the figures overall, the frame 9 which forms the housing door 7 can be reconfigured by insertion and removal of side parts 12, with the result that the frame 9 is suitable optionally for one display screen, for two display screens, or for three display screens or of course also for more display screens. Although this is not shown in the drawings, the transverse connecting limbs 16 might also be of modular construction in a corresponding way from a plurality of transverse parts which can be fixed behind one another, in order to arrange a plurality of display screens next to one another in a corresponding way and in order for it to be possible to change the number of display screens which are arranged next to one another.

The display screens 3 can advantageously be mounted onto the frame 9 from a rear side, in particular can be placed onto a rear side of the frame 9 in the respective frame cutout, with the result that the frame covers a narrow edge strip of the respective display screen at least in sections.

Figure 6:
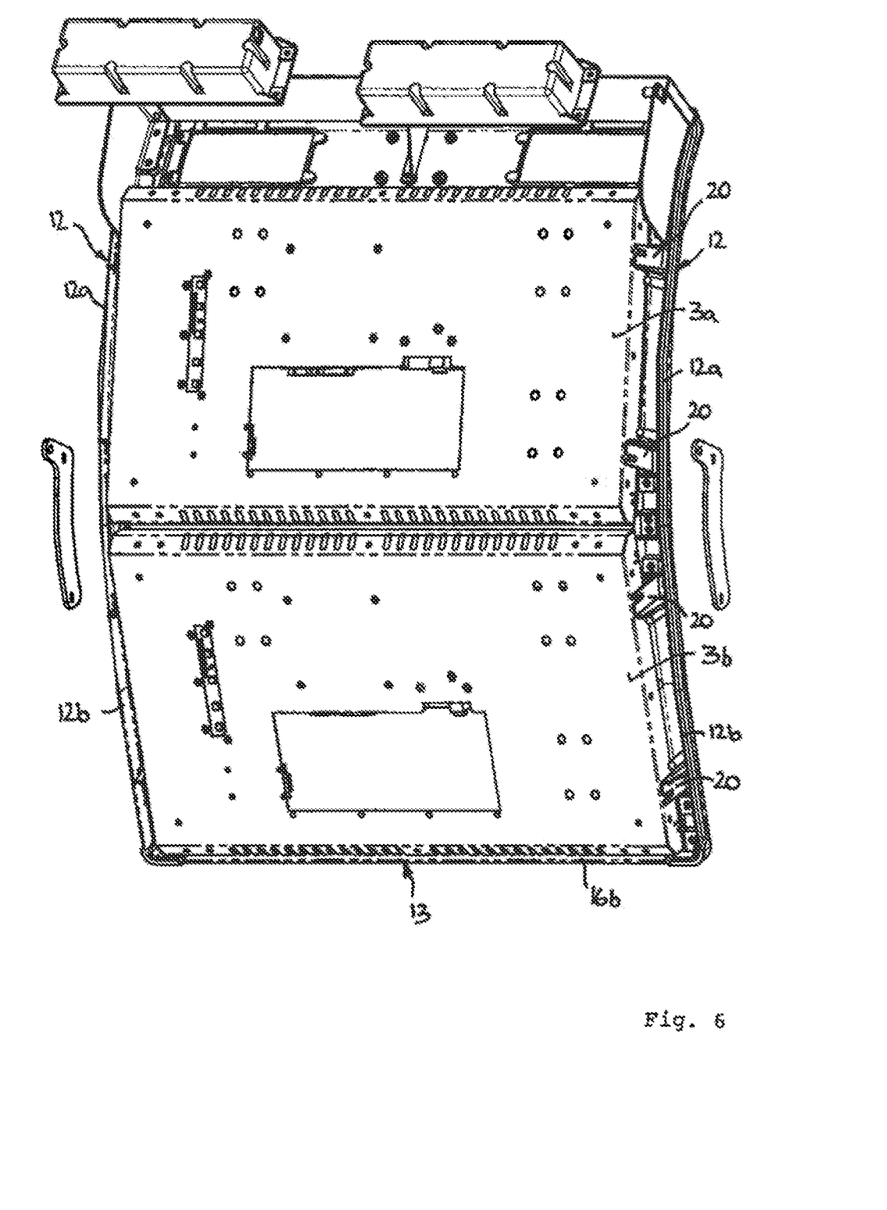
FIG. 6 shows a perspective rear view of the frame from FIG. 5 and the display screens which are fastened thereto.
Figure 7:
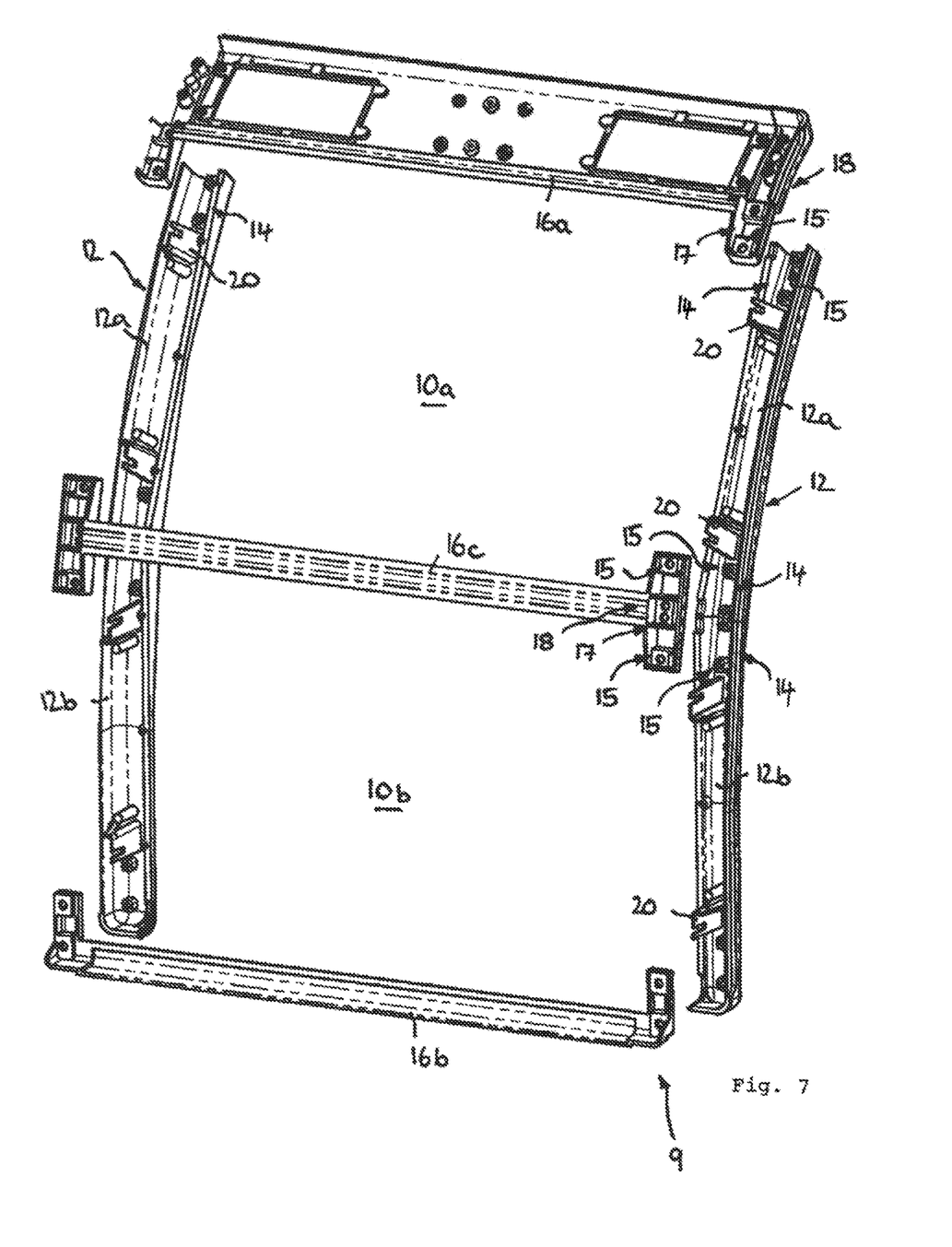
FIG. 7 shows a perspective rear view of the frame from the two preceding figures without an illustration of the display screens, the frame parts being shown detached from one another in an exploded illustration.

As FIGS. 5 and 6 illustrate, two protruding holding limbs 20 can be provided, for example can be formed integrally, for example on the side parts 12a, 12b of the side limbs 12 towards the rear side of the frame, which holding limbs 20 engage laterally around a display screen which is fixed to the frame 9 on the rear side. The abovementioned holding limbs 20 can be connected rigidly to the display screens 3, for example, by way of transverse pins or transverse screws. In particular, according to one embodiment, a connecting part (connecting bracket) 22 can additionally be provided, in order to connect the fixed display screens 3a and 3b between two adjacent holding limbs 20 and to additionally increase the rigidity of the housing door configuration as a result.

As is shown, in particular, in FIGS. 5 to 8, the transverse termination part 16a additionally has two receptacles for a loudspeaker arrangement 23 here.

The frame parts can be configured as profiled strips and can be composed of metal or plastic or another material, for example can be injection-molded.

According to one embodiment, the frame parts can preferably have, for example, mirrored and/or chromed regions on the front side (that is to say, the side which faces the operator position). Furthermore, illumination elements, for instance in the form of RGB LED or OLED strips, can be integrated into the frame parts, and the connecting sections 17 of the transverse parts 16 or the end sections 14 of the side parts 12 can have corresponding electrical connecting contacts (not shown in greater detail in the figures) for the electrical connection of the LED strips.

The invention claimed is:

1. A visual display unit device, comprising:
a unit housing comprising a housing door configured for opening and closing the unit housing, wherein the housing door forms a modular frame having a frame first configuration and a frame second configuration,
wherein when the modular frame is in the frame first configuration, the modular frame comprises first limbs that define a frame cutout, wherein when the modular frame is in the frame second configuration, the modular frame comprises one or more of the first limbs and one or more second limbs such that the one or more first limbs and one or more second limbs define the frame cutout when the modular frame is in the frame second configuration, wherein the one or more first limbs and one or more second limbs of the frame second configuration give the housing door torsional rigidity in all spatial dimensions, wherein the frame cutout has a different size when the modular frame is in the frame second configuration than when the modular frame is in the frame first configuration, wherein when the modular frame is in the frame first configuration, the frame cutout encloses a first display screen, and wherein when the modular frame is in the frame second configuration, the frame cutout to encloses a second display screen having a different size than the first display screen.

2. The device of claim 1, wherein the frame limbs comprise frame parts having connectors compatible to one another on their end sections, and wherein the connectors connect a respective frame part optionally to different ones of the other frame parts.

3. The device of claim 2, wherein the connectors are positioned in arrangement patterns which correspond to one another on the end sections.

4. The device of claim 1, wherein the one or more of the first limbs comprises one or more first side limbs and one or more first transverse connecting limbs which connect the one or more first side limbs, wherein the one or more second limbs comprises one or more second side limbs and one or more second transverse connecting limbs which connect the one or more second side limbs, wherein the one or more second side limbs and one or more second transverse connecting limbs differ in length from the one or more first side limbs and the one or more first transverse connecting limb, respectively.

5. The device of claim 4, wherein the side limbs are configured to be oriented so as to be upright, and wherein the transverse limbs are configured to be oriented so as to lie down.

6. The device of claim 1, wherein in a third configuration, the frame cutout encloses both the first and second display screen, forming a first frame cutout and second frame cutout, such that the first and second frame cutouts share at least one limb of the one or more of the first limbs or the one or more of the second limbs, and wherein the frame is reconfigurable between the first configuration and the second configuration and the third configuration.

7. The device of claim 6, wherein the side limbs further comprising side parts and the intermediate transverse connecting limb comprising intermediate transverse parts and the intermediate transverse parts having first connectors for connecting the side parts onto one another and second connectors for connecting to the side parts to corresponding intermediate traverse parts.

8. The device of claim 7, wherein the first and second connectors cover the side parts.

9. The device of claim 8, wherein the side parts are fixed onto one another behind one another being held on one another by way of the intermediate transverse part.

10. The device of claim 4, wherein the side limbs or the transverse connecting limbs have a longitudinal axis which is curved in an arcuate manner or is bent in a polygonal manner.

11. The device of claim 1, wherein the frame cutouts are configured to be inclined at an obtuse angle with respect to one another, and wherein the frame cutouts are configured to enclose a plurality of display screens which are inclined at an obtuse angle with respect to one another and are arranged above or next to one another.

12. The device of claim 1, wherein the at least one display screen is configured to be fastened to the frame, and wherein the at least one display screen is configured to be opened and closed together with the housing door.

13. The device of claim 1, wherein the at least one display screen is configured to be fastened to a frame rear side, and wherein the frame is configured to cover or engage around a front-side edge strip of the at least one display screen at least in sections.

14. The device of claim 1, wherein the frame comprises holding webs, wherein the holding webs are configured to project from a frame rear side, and wherein the holding webs are configured to engage laterally around the at least one display screen, and wherein the holding webs are connected fixedly to the display screen.

15. The device of claim 1, wherein the housing door is configured to mount on a housing main body such that it can be pivoted about a door pivoting axis, wherein said door pivoting axis is arranged so as to lie on an upper end section of the housing door.

16. The device of claim 1, wherein the visual display unit is a part of at least one of a gaming, an amusement, or a gambling machine.

17. A unit housing of a visual display unit, the unit housing comprising:

a unit housing comprising a housing door configured for opening and closing the unit housing, wherein the housing door forms a modular frame having a frame first configuration and a frame second configuration, wherein when the modular frame is in the frame first configuration, the modular frame has a first pair of limbs and a second pair of limbs, wherein the second pair of limbs are transverse to the first pair of limbs and hold the first pair of limbs together, wherein the second pair of limbs have connectors releasably connectable to the first pair of limbs such that the modular frame is reconfigurable from the frame first configuration to the frame second configuration, such that the first pair of limbs are separable from each other, and such that the second pair of limbs are replaceable with a third pair of limbs, wherein when the unit housing is in an upright position and the modular frame is in the frame first configuration, the first pair of limbs are left and right side limbs of the modular frame, wherein when the modular frame is in the frame second configuration, the modular frame has the first pair of limbs and the third pair of limbs, wherein the third pair of limbs are transverse to the first pair of limbs and hold the first pair of limbs together, wherein the third pair of limbs have connectors releasably connectable to the first pair of limbs such that the modular frame is reconfigurable from the frame second configuration to the frame first configuration, such that the first pair of limbs are separable from each other, and such that the third pair of limbs are replaceable with the second pair of limbs, wherein when the unit housing is in the upright position and the modular frame is in the frame second configuration, the first pair of limbs are left and right side limbs of the modular frame, wherein when the modular frame is in the frame first configuration, the first and second pair of limbs form the housing door and give the housing door torsional rigidity in all spatial dimensions, wherein when the modular frame is in the frame first configuration, the first and second pair of limbs define a frame cutout, wherein when the modular frame is in the frame second configuration, the first and third pair of limbs form the housing door and give the housing door torsional rigidity in all spatial dimensions, wherein when the modular frame is in the frame second configuration, the first and third pair of limbs define the frame cutout, and wherein the frame cutout has a different size when the modular frame is in the frame second configuration than when the modular frame is in the frame first configuration, wherein when the modular frame is in the frame first configuration, the frame cutout encloses a first display screen, and wherein when the modular frame is in the frame second configuration, the frame cutout encloses a second display screen having a different size than the first display screen.

18. A housing door of a unit housing of a visual display unit comprising:
a unit housing comprising a housing door forming a modular frame for at least one display screen, wherein the modular frame has a frame first configuration, a frame second configuration, and a frame third configuration, wherein when the modular frame is in the frame first configuration, the modular frame has a first pair of limbs and a second pair of limbs transverse to the first pair of limbs, wherein when the modular frame is in the frame first configuration, the second pair of limbs have connectors releasably connected to the first pair of limbs, wherein when the modular frame is in the frame first configuration, the first and second pair of limbs form the housing door and give the housing door torsional rigidity in all spatial dimensions, wherein when the modular frame is in the frame second configuration, the modular frame has the first pair of limbs and a third pair of limbs transverse to the first pair of limbs, wherein when the modular frame is in the frame second configuration, the third pair of limbs have connectors releasably connected to the first pair of limbs, wherein when the modular frame is in the frame second configuration, the first and third pair of limbs form the housing door and give the housing door torsional rigidity in all spatial dimensions, wherein when the modular frame is in the frame third configuration, the modular frame has the first pair of limbs and at least three transverse limbs, wherein when the modular frame is in the frame third configuration, the at least three transverse limbs have connectors releasably connected to the first pair of limbs, wherein the at least three transverse limbs are positionable in a limb first position, a limb second position, and a limb third position, wherein the at least three transverse limbs are interchangeable with each other such that the at least three transverse limbs are each positionable in any one of the limb first, second, and third positions, wherein when the modular frame is in the frame third configuration, the first pair of limbs and the at least three transverse limbs form the housing door and give the housing door torsional rigidity in all spatial dimensions, wherein the modular frame is reconfigurable between the frame first, second, and third configurations such that the first pair of limbs are separable from each other, such that the second pair of limbs are replaceable with the third pair of limbs and vice versa, and such that the second pair of limbs are replaceable with the at least three transverse limbs and vice versa, wherein when the modular frame is in the frame first and second configurations, the modular frame has one frame cutout, wherein when the modular frame is in the frame third configuration, the modular frame has two frame cutouts, and wherein when the unit housing is in an upright position and the modular frame is in the frame first, second, and third configurations, the first pair of limbs are left and right side limbs of the modular frame.

19. The device of claim 1, wherein the modular frame is configured to further be assembled in a variable manner from a plurality of frame parts in one or more frame third configurations different from the frame first and second configurations in which the modular frame has at least one of a different number of frame cutouts or frame cutouts of different sizes when in the one or more frame third configurations than when in the frame first configuration or the frame second configuration, and wherein the modular frame is reconfigurable between the frame first configuration, the frame second configuration, and the one or more frame third configurations.

20. A visual display unit device, comprising:
a unit housing comprising a housing door configured for opening and closing the unit housing, wherein the housing door forms a modular frame having a frame first configuration and a frame second configuration, wherein when the modular frame is in the frame first configuration, the modular frame has first limbs and second limbs, wherein the first limbs are transverse to the second limbs, wherein when the modular frame is in the frame first configuration, each second limb is releasably connected to two first limbs via releasable connectors, wherein when the modular frame is in the frame first configuration, the first and second limbs define one or multiple frame cutouts, wherein each of the one or multiple frame cutouts has a frame cutout height and a frame cutout width, wherein when the unit housing is in an upright position and the modular frame is in the frame first configuration, the first limbs are vertical limbs and the second limbs are horizontal limbs, wherein when the modular frame is in the frame first configuration, each first limb is replaceable with a different first limb, wherein when the modular frame is in the frame first configuration, additional first limbs are insertable into the modular frame to increase the frame cutout height of at least one of the one or multiple frame cutouts, wherein when the modular frame is in the frame first configuration, each second limb is replaceable with a different second limb, wherein when the modular frame is in the frame first configuration, additional second limbs are insertable into the modular frame to increase the frame cutout width of the one or multiple frame cutouts, wherein when the modular frame is in the frame first configuration, one or multiple additional second limbs are insertable into the modular frame to partition at least one of the one or multiple frame cutouts into two or more frame cutouts, wherein when the modular frame is in the second configuration, at least one of the first limbs of the frame second configuration is different than one of the first limbs of the frame first configuration and/or at least one of the second limbs of the frame second configuration is different than one of the second limbs of the frame first configuration.

\* \* \* \* \*